(12) United States Patent
Chen et al.

(10) Patent No.: US 11,049,823 B2
(45) Date of Patent: Jun. 29, 2021

(54) INTEGRATED CIRCUIT PACKAGE APPARATUS DEPLOYED WITH ANTENNA AND METHOD FOR MANUFACTURING INTEGRATED CIRCUIT PACKAGE APPARATUS

(71) Applicant: Huawei Technologies Co., Ltd., Shenzhen (CN)

(72) Inventors: Tewei Chen, Shenzhen (CN); Guowen Liu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 26 days.

(21) Appl. No.: 16/185,869

(22) Filed: Nov. 9, 2018

(65) Prior Publication Data

US 2019/0081013 A1 Mar. 14, 2019

Related U.S. Application Data (63) Continuation of application No. PCT/CN2016/112986, filed on Dec. 29, 2016.

(30) Foreign Application Priority Data

May 13, 2016 (CN) .......................... 201610318942.3

(51) Int. Cl.
*H01Q 1/22* (2006.01)
*H01L 23/66* (2006.01)
(Continued)

(52) U.S. Cl.
CPC .......... *H01L 23/66* (2013.01); *H01L 21/4853* (2013.01); *H01L 23/49838* (2013.01);
(Continued)

(58) Field of Classification Search
CPC ............................. H01Q 1/2283; H01L 23/66
See application file for complete search history.

(56) References Cited

U.S. PATENT DOCUMENTS

| | | | |
|---|---|---|---|
| 6,849,936 B1 | 2/2005 | Berman et al. | |
| 7,253,504 B1 | 8/2007 | Zhai et al. | |

(Continued)

FOREIGN PATENT DOCUMENTS

| | | |
|---|---|---|
| CN | 102299142 A | 12/2011 |
| CN | 103022014 A | 4/2013 |

(Continued)

OTHER PUBLICATIONS

Semiconductor Glossary Entry by Semiconductor OneSource for via available through Wayback Machine Archiving on Aug. 20, 2012 at http://www.semi1source.com/glossary/default.asp?searchterm=via (Year: 2012).*

(Continued)

*Primary Examiner* — Grant S Withers
(74) *Attorney, Agent, or Firm* — Conley Rose, P.C.

(57) ABSTRACT

An integrated circuit package apparatus deployed with an antenna and a method for manufacturing an integrated circuit package apparatus, where the integrated circuit package apparatus includes a package substrate, an antenna, a chip, and a connection circuit. The package substrate includes at least one ground plane, the antenna is deployed on an external surface of one side of the package substrate and is located on one side of the at least one ground plane, the chip and the connection circuit are deployed on the other side of the at least one ground plane, where the antenna is isolated from the chip and the connection circuit using the at least one ground plane, and the antenna is coupled to the chip using the connection circuit and a first metal through hole in a thickness direction of the package substrate.

20 Claims, 6 Drawing Sheets

(51) Int. Cl.
*H01L 23/58* (2006.01)
*H01L 23/552* (2006.01)
*H01L 21/48* (2006.01)
*H01L 23/498* (2006.01)

(52) U.S. Cl.
CPC ............ *H01L 23/552* (2013.01); *H01L 23/58* (2013.01); *H01Q 1/2283* (2013.01); *H01L 2223/6616* (2013.01); *H01L 2223/6677* (2013.01)

(56) References Cited

U.S. PATENT DOCUMENTS

| | | | |
|---|---|---|---|
| 9,331,030 B1 | 5/2016 | Tsai et al. | |
| 2005/0088260 A1* | 4/2005 | Ajioka | H01L 23/66 333/247 |
| 2006/0049995 A1 | 3/2006 | Imaoka et al. | |
| 2007/0289771 A1* | 12/2007 | Osaka | H05K 1/0236 174/250 |
| 2010/0001906 A1 | 1/2010 | Akkermans et al. | |
| 2012/0119969 A1* | 5/2012 | MacDonald | H05K 1/0236 343/841 |
| 2012/0212384 A1 | 8/2012 | Kam et al. | |
| 2013/0099006 A1* | 4/2013 | Hong | H01Q 1/2283 235/492 |
| 2013/0292808 A1 | 11/2013 | Yen et al. | |
| 2015/0145108 A1 | 5/2015 | Yap et al. | |
| 2016/0240492 A1* | 8/2016 | Wolter | H01Q 1/526 |

FOREIGN PATENT DOCUMENTS

| | | |
|---|---|---|
| CN | 103367269 A | 10/2013 |
| CN | 103531903 A | 1/2014 |
| CN | 104701304 A | 6/2015 |

OTHER PUBLICATIONS

Foreign Communication From A Counterpart Application, European Application No. 16901547.6, Extended European Search Report dated Feb. 21, 2019, 7 pages.
Machine Translation and Abstract of Chinese Publication No. CN102299142, Dec. 28, 2011, 12 pages.
Machine Translation and Abstract of Chinese Publication No. CN103022014, Apr. 3, 2013, 15 pages.
Machine Translation and Abstract of Chinese Publication No. CN103367269, Oct. 23, 2013, 17 pages.
Foreign Communication From A Counterpart Application, Taiwanese Application No. 10620937750, Taiwanese Office Action dated Sep. 12, 2017, 6 pages.
Foreign Communication From A Counterpart Application, PCT Application No. PCT/CN2016/112986, English Translation of International Search Report dated Apr. 6, 2017, 2 pages.
Foreign Communication From A Counterpart Application, PCT Application No. PCT/CN2016/112986, English Translation of Written Opinion dated Apr. 6, 2017, 5 pages.
Machine Translation and Abstract of Chinese Publication No. CN103531903, Jan. 22, 2014, 9 pages.
Foreign Communication From A Counterpart Application, Chinese Application No. 201610318942.3, Chinese Office Action dated Mar. 18, 2019, 8 pages.

* cited by examiner

INTEGRATED CIRCUIT PACKAGE APPARATUS DEPLOYED WITH ANTENNA AND METHOD FOR MANUFACTURING INTEGRATED CIRCUIT PACKAGE APPARATUS

CROSS-REFERENCE TO RELATED APPLICATIONS

This application is a continuation of International Patent Application No. PCT/CN2016/112986 filed on Dec. 29, 2016, which claims priority to Chinese Patent Application No. 201610318942.3 filed on May 13, 2016. The disclosures of the aforementioned applications are hereby incorporated by reference in their entireties.

TECHNICAL FIELD

The present disclosure relates to the integrated circuit package field, and in particular, to an integrated circuit package apparatus deployed with an antenna and a method for manufacturing an integrated circuit package apparatus.

BACKGROUND

With development of science and technology, electronic devices become increasingly popular, and the electronic devices have more functions. In the electronic devices, an integrated circuit is widely applied due to advantages such as small size, light weight, high reliability, and easy to perform mass production. An integrated circuit package apparatus can integrate all components that are required by a circuit having a specific function into one chip, and package the chip on a package substrate. The components may include elements such as a semiconductor, a resistor, and a capacitor, connection conducting wires between the elements, and the like. If the chip needs to receive or transmit a signal, an antenna may further be deployed on the integrated circuit package apparatus.

Figure 1:
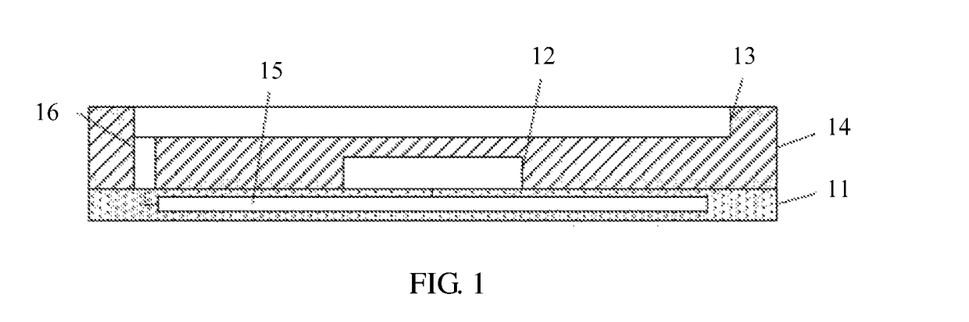
FIG. 1 is a cutaway drawing of an integrated circuit package apparatus.

In related technologies, as shown in FIG. 1, an integrated circuit package apparatus deployed with an antenna includes a package substrate 11, a chip 12, an antenna 13, a plastic package body 14, and a connection circuit 15. The chip 12 is deployed on a side of the package substrate 11, and is connected to the connection circuit 15 on the package substrate 11. The plastic package body 14 covers the side deployed with the chip 12 on the package substrate 11, and the antenna 13 is deployed on a surface of the plastic package body 14. The plastic package body 14 is wrapped around the chip 12, where the chip 12 is isolated from the antenna 13. The antenna 13 is connected to the connection circuit 15 on the package substrate 11 using a metal through hole 16.

In a process of implementing the present disclosure, the inventor finds that other approaches have at least the following problems. First, the plastic package body causes a relatively large loss to electromagnetic energy of the antenna, as a result, radiation efficiency of the antenna is reduced, and because the loss of the electromagnetic energy is relatively large, a radiation distance of the antenna is reduced, and sensitivity of the antenna for receiving a signal is also lowered, and second, isolation between the antenna and the chip and isolation between the antenna and the connection circuit are poor, and accordingly signals between the antenna and the chip and the connection circuit are mutually interfered easily, and performance of the chip is affected.

SUMMARY

To resolve the problems in the other approaches, embodiments of the present disclosure provide an integrated circuit package apparatus deployed with an antenna and a method for manufacturing an integrated circuit package apparatus. The technical solutions are as follows.

According to a first aspect, an integrated circuit package apparatus deployed with an antenna is provided, and the integrated circuit package apparatus includes a package substrate, an antenna, a chip, and a connection circuit, where the package substrate includes at least one ground plane, the antenna is deployed on an external surface of one side of the package substrate and is located on one side of the at least one ground plane, the chip and the connection circuit are deployed on the other side of the at least one ground plane, where the antenna is isolated from the chip and the connection circuit using the at least one ground plane, and the antenna is connected to the chip using the connection circuit and a first metal through hole in a thickness direction of the package substrate.

The integrated circuit package apparatus omits a plastic package body, and the antenna is deployed on the external surface of one side of the package substrate in order to prevent the plastic package body from consuming electrical performance of an antenna signal transmitted or received by the antenna, improve work efficiency of the antenna, and reduce costs. In addition, the integrated circuit package apparatus isolates, using the at least one ground plane, the antenna from a non-antenna circuit including the chip and the connection circuit such that mutual interference of signals between the antenna and the non-antenna circuit is avoided, and reliability and stability of the integrated circuit package apparatus are improved.

It should be noted that the integrated circuit package apparatus deployed with the antenna generally includes the antenna and the non-antenna circuit including the chip and the connection circuit. To avoid mutual interference between an antenna signal transmitted or received by the antenna and an electrical signal of the non-antenna circuit, the antenna may be isolated, using the at least one ground plane, from the non-antenna circuit including the chip and the connection circuit.

It should be further noted that the at least one ground plane may include only one ground plane, or may include multiple ground planes. When a quantity of the multiple ground planes is larger, an effect of isolating the antenna from the non-antenna circuit by the at least one ground plane is better.

With reference to the first aspect, in a first possible implementation of the first aspect, an anti-pad is deployed around the first metal through hole on each of the at least one ground plane, the anti-pad encircles the first metal through hole, and the anti-pad is configured to form a gap between the at least one ground plane and the first metal through hole, where the at least one ground plane is insulated from the first metal through hole.

It should be noted that when the first metal through hole is connected to the at least one ground plane, a short circuit of the antenna is caused, and normal use of the integrated circuit package apparatus is affected. Therefore, the anti-pad is deployed around the first metal through hole on each of the at least one ground plane to insulate the at least one ground plane from the first metal through hole in order to insulate the at least one ground plane from the antenna.

With reference to the first possible implementation of the first aspect, in a second possible implementation of the first aspect, when the at least one ground plane includes multiple ground planes, two adjacent ground planes in the multiple ground planes are connected using a second metal through hole in the thickness direction of the package substrate.

It should be noted that when the at least one ground plane includes the multiple ground planes, and the integrated circuit package apparatus requires high isolation between the antenna and the non-antenna circuit, the two adjacent ground planes in the multiple ground planes may be connected using the second metal through hole. When the integrated circuit package apparatus requires low isolation between the antenna and the non-antenna circuit, or complexity of a process for manufacturing the integrated circuit package apparatus needs to be reduced, the two adjacent ground planes in the multiple ground planes may not be connected.

With reference to the first aspect, in another possible implementation of the first aspect, the chip is deployed inside the package substrate.

When the chip is deployed inside the package substrate, the package substrate may protect the chip.

With reference to the first aspect, in another possible implementation of the first aspect, the chip is deployed on an external surface of the other side of the package substrate.

When the chip is deployed on the external surface of the other side of the package substrate, the complexity of a process for manufacturing the integrated circuit package apparatus can be reduced.

It should be noted that the other side of the package substrate is a side deployed with no antenna on the package substrate.

It should be further noted that in actual application, the chip may also be deployed on another location of the package substrate, provided that it can be ensured that the antenna is isolated, using the at least one ground plane, from a non-antenna circuit including the chip.

With reference to the first aspect, in a third possible implementation of the first aspect, a ground clad copper is deployed on the external surface of the side deployed with the antenna on the package substrate, and space exists between the ground clad copper and the antenna.

The ground clad copper can improve or adjust warpage that covers the package substrate such that reliability and weldability of the integrated circuit package apparatus are improved.

With reference to the first aspect, in a fourth possible implementation of the first aspect, projection areas of the antenna, the chip, and the connection circuit in the thickness direction of the package substrate are located inside the at least one ground plane.

When projection of the antenna and the non-antenna circuit including the chip and the connection circuit in the thickness direction of the package substrate is located inside the at least one ground plane, it is ensured that the at least one ground plane can better isolate the antenna from the non-antenna circuit, that is, isolation between the antenna and the non-antenna circuit is improved such that reliability and stability of the integrated circuit package apparatus are improved.

It should be noted that shapes of all ground planes in the at least one ground plane may be the same or different.

It should be further noted that for each ground plane in the at least one ground plane, the ground plane may be a complete plane, that is, include only the anti-pad, or may be an incomplete plane, that is, the ground plane may be a mesh plane, or the ground plane includes both the anti-pad and another hole or notch. When the ground plane is more complete, an effect of isolating the antenna from the non-antenna circuit by the at least one ground plane is better, that is, the isolation between the antenna and the non-antenna circuit is higher.

According to a second aspect, a method for manufacturing an integrated circuit package apparatus is provided, and the method includes deploying at least one ground plane and a connection circuit in a package substrate, where the connection circuit is deployed on one side of the at least one ground plane, deploying a chip on an external surface of one side of the package substrate in which the at least one ground plane and the connection circuit are deployed, where the connection circuit is connected to the chip, and the chip and the connection circuit are located on a same side of the at least one ground plane, deploying a first metal through hole in a thickness direction of the package substrate deployed with the chip, where the first metal through hole is connected to the connection circuit, and deploying an antenna on an external surface of the other side of the package substrate in which the first metal through hole is deployed, where the antenna is connected to the chip using the first metal through hole and the connection circuit, and the at least one ground plane isolates the antenna from the chip and the connection circuit.

With reference to the second aspect, in a first possible implementation of the second aspect, before the deploying at least one ground plane and a connection circuit in a package substrate, the method further includes deploying an anti-pad on each ground plane in the at least one ground plane, where the anti-pad encircles the first metal through hole, and forming a gap between the at least one ground plane and the first metal through hole, where the at least one ground plane is insulated from the first metal through hole.

With reference to the first possible implementation of the second aspect, in a second possible implementation of the second aspect, when the at least one ground plane includes multiple ground planes, the method further includes deploying a second metal through hole between two adjacent ground planes in the multiple ground planes in the thickness direction of the package substrate in order to connect the two adjacent ground planes in the multiple ground planes.

With reference to the second aspect, in a third possible implementation of the second aspect, after the deploying an antenna on an external surface of the other side of the package substrate in which the first metal through hole is deployed, the method further includes deploying a ground clad copper on the external surface of the other side of the package substrate deployed with the antenna, where space exists between the ground clad copper and the antenna.

According to a third aspect, a method for manufacturing an integrated circuit package apparatus is provided, and the method includes deploying at least one ground plane, a connection circuit, and a chip in a package substrate, where the connection circuit is connected to the chip, and the connection circuit and the chip are located on a same side of the at least one ground plane, deploying a first metal through hole in a thickness direction of the package substrate in which the at least one ground plane, the connection circuit, and the chip are deployed, where the first metal through hole is connected to the connection circuit, and deploying an antenna on an external surface of a side, away from the connection circuit and the chip, of the package substrate in which the first metal through hole is deployed, where the antenna is connected to the chip using the first metal through hole and the connection circuit, and the at least one ground plane isolates the antenna from the chip and the connection circuit.

With reference to the third aspect, in a first possible implementation of the third aspect, before the deploying at least one ground plane, a connection circuit, and a chip in a package substrate, the method further includes deploying an anti-pad on each ground plane in the at least one ground plane, where the anti-pad encircles the first metal through hole, and forming a gap between the at least one ground plane and the first metal through hole, where the at least one ground plane is insulated from the first metal through hole.

With reference to the first possible implementation of the third aspect, in a second possible implementation of the third aspect, when the at least one ground plane includes multiple ground planes, the method further includes deploying a second metal through hole between two adjacent ground planes in the multiple ground planes in the thickness direction of the package substrate in order to connect the two adjacent ground planes in the multiple ground planes.

With reference to the third aspect, in a third possible implementation of the third aspect, after the deploying an antenna on an external surface of a side, away from the connection circuit and the chip, of the package substrate in which the first metal through hole is deployed, the method further includes deploying a ground clad copper on the external surface of the side deployed with the antenna on the package substrate, where space exists between the ground clad copper and the antenna.

The technical solutions provided in the embodiments of the present disclosure have the following beneficial effects. The integrated circuit package apparatus includes the package substrate, the antenna, the chip, and the connection circuit. First, the package substrate includes the at least one ground plane, the antenna is deployed on the external surface of one side of the package substrate, and the integrated circuit package apparatus does not include the plastic package body. Therefore, a loss of the antenna signal of the antenna is relatively small, and sensitivity and transmission efficiency of the antenna are improved. In addition, the antenna is located on one side of the at least one ground plane, and the chip and the connection circuit are deployed on the other side of the at least one ground plane, where the antenna is isolated from the chip and the connection circuit using the at least one ground plane. The antenna is connected to the chip using the connection circuit and the first metal through hole in the thickness direction of the package substrate. The chip and the connection circuit are non-antenna circuits. The antenna is isolated from the chip and the connection circuit using the at least one ground plane, where mutual interference of signals between the antenna and the non-antenna circuit is avoided, and reliability and stability of the integrated circuit package apparatus are improved.

BRIEF DESCRIPTION OF DRAWINGS

To describe the technical solutions in some of the embodiments of the present disclosure more clearly, the following briefly describes the accompanying drawings describing some of the embodiments. The accompanying drawings in the following description show merely some embodiments of the present disclosure, and persons of ordinary skill in the art may still derive other drawings from these accompanying drawings without creative efforts.

Reference signs in the drawings are as follows.
11: Package substrate;
12: Chip;
13: Antenna;
14: Plastic package body;
15: Connection circuit;
16: Metal through hole;
21: At least one ground plane;
22: Package substrate;
23: Antenna;
24: Chip;
25: Connection circuit;
26: First metal through hole;
27: Second metal through hole;
28: Ground clad copper; and
211: Anti-pad.

DESCRIPTION OF EMBODIMENTS

To make the objectives, technical solutions, and advantages of the present disclosure clearer, the following further describes the embodiments of the present disclosure in detail with reference to the accompanying drawings.

Figure 2:
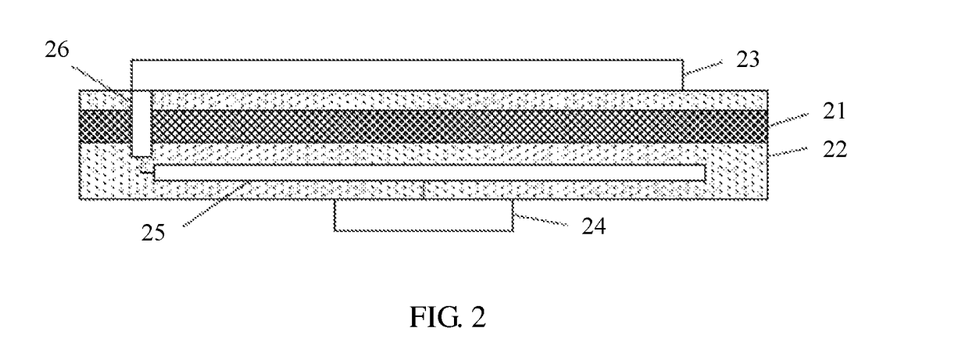
FIG. 2 is a cutaway drawing of an integrated circuit package apparatus according to an embodiment of the present disclosure.

FIG. 2 is a cutaway drawing of an integrated circuit package apparatus deployed with an antenna according to an embodiment of the present disclosure. Referring to FIG. 2, the integrated circuit package apparatus includes a package substrate 22, an antenna 23, a chip 24, and a connection circuit 25. The package substrate 22 includes at least one ground plane 21, the antenna 23 is deployed on an external surface of one side of the package substrate 22 and is located on one side of the at least one ground plane 21, the chip 24 and the connection circuit 25 are deployed on the other side of the at least one ground plane 21, where the antenna 23 is isolated from the chip 24 and the connection circuit 25 using the at least one ground plane 21, and the antenna 23 is connected to the chip 24 using the connection circuit 25 and a first metal through hole 26 in a thickness direction of the package substrate 22.

The integrated circuit package apparatus deployed with an antenna usually includes the antenna 23 and a non-antenna circuit. The non-antenna circuit may include the chip 24 and the connection circuit 25. The antenna 23 can transmit or receive a signal. The chip 24 and the connection circuit 25 can transmit or receive an electrical signal. When the antenna 23 is not isolated from the non-antenna circuit, the antenna signal transmitted or received by the antenna 23 and the electrical signal of the non-antenna circuit are mutually interfered, as a result, work efficiency of the integrated circuit package apparatus is reduced, and normal use of the integrated circuit package apparatus is affected. Therefore, to avoid mutual interference of signals between the antenna 23 and the non-antenna circuit, and to improve the work efficiency and stability of the integrated circuit package apparatus, the antenna 23 may be deployed on the external surface of one side of the package substrate 22 and located on one side of the at least one ground plane 21, and the non-antenna circuit such as the chip 24 and the connection circuit 25 is deployed on the other side of the at least one ground plane 21. Because the at least one ground plane 21 is a grounding conductor, the at least one ground plane 21 can shield the antenna signal and the electrical signal, where the antenna 23 is isolated from the non-antenna circuit.

It should be noted that, when the antenna 23 is deployed on the external surface of one side of the package substrate 22, the antenna 23 may be deployed on the external surface of one side of the package substrate 22 using an etching process.

It should be further noted that a shape and a size of the antenna 23 may be determined according to a requirement in an application. This embodiment of the present disclosure imposes no specific limitation thereto.

When the antenna 23 is deployed on the external surface of one side of the package substrate 22 using the etching process, because the integrated circuit package apparatus does not include a plastic package body, an antenna signal of the antenna 23 is not consumed by the plastic package body, and sensitivity and transmission efficiency of the antenna 23 are improved. In addition, precision of an antenna that is deployed using the etching process is higher than precision of an antenna that is deployed using an electroplating process. Therefore, a frequency offset caused by an excessively large antenna precision error is avoided, and a problem that impedance of the antenna mismatches impedance of the integrated circuit package apparatus because it is difficult to control the impedance of the antenna due to the electroplating process is avoided. In addition, because the antenna 23 is located on one side of the at least one ground plane 21, the at least one ground plane 21 may be used as a reference plane and a reflection plane of the antenna 23 such that difficulty of controlling impedance of the antenna 23 is further reduced, that is, work efficiency of the antenna 23 is improved.

It should be further noted that the connection circuit 25 is a circuit that connects the chip 24 and another circuit component in the integrated circuit package apparatus, and the other circuit component may be a metal through hole, a package pin, or the like. This embodiment of the present disclosure imposes no specific limitation thereto.

When the integrated circuit package apparatus further includes a package pin, the package pin may be deployed on the external surface of the side deployed with the antenna 23 on the package substrate 22, or may be deployed on an external surface of the other side of the package substrate 22. Certainly, the package pin may also be deployed on another location of the package substrate 22 according to a requirement in actual application. This embodiment of the present disclosure imposes no specific limitation thereto.

In addition, when the integrated circuit package apparatus further includes another non-antenna circuit, the other non-antenna circuit may also be deployed on the other side of the at least one ground plane 21, where the other non-antenna circuit is isolated from the antenna 23.

The other non-antenna circuit may be added according to a requirement in an application. The present disclosure imposes no specific limitation thereto.

Figure 3:
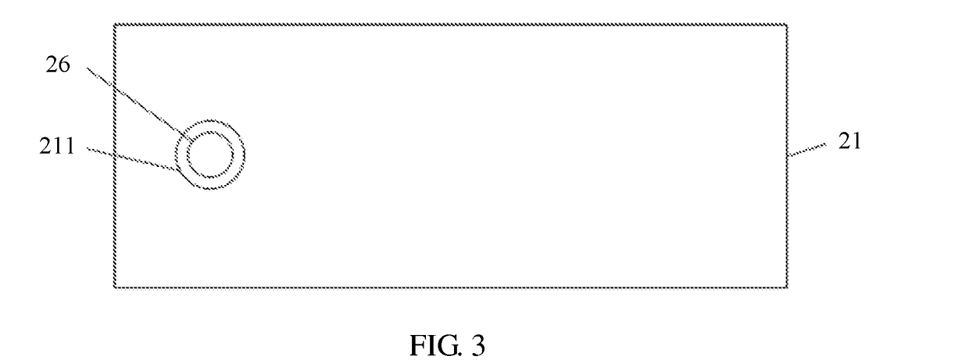
FIG. 3 is a top view of at least one ground plane according to an embodiment of the present disclosure.
Figure 4:
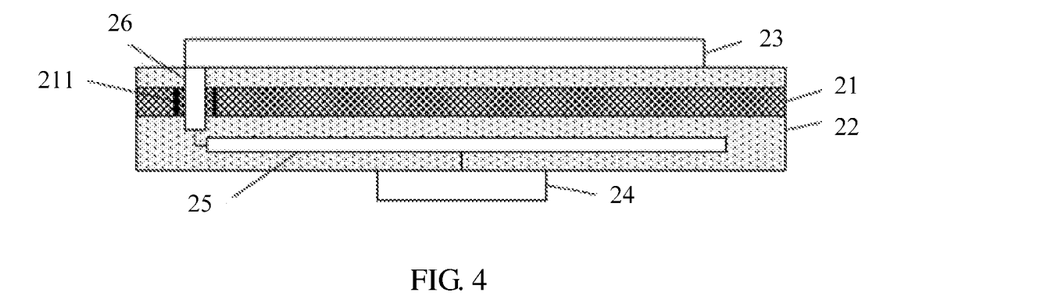
FIG. 4 is a cutaway drawing of another integrated circuit package apparatus according to an embodiment of the present disclosure.

Further, as shown in FIG. 3 and FIG. 4, an anti-pad 211 is deployed around the first metal through hole 26 on each of the at least one ground plane 21, the anti-pad 211 encircles the first metal through hole 26, and the anti-pad 211 is configured to form a gap between the at least one ground plane 21 and the first metal through hole 26 in order to insulate the at least one ground plane 21 from the first metal through hole 26.

Because the first metal through hole 26 is configured to connect the antenna 23 and the connection circuit 25 in order to connect the antenna 23 and the chip 24 using the connection circuit 25, when the first metal through hole 26 is connected to the at least one ground plane 21, a short circuit of the antenna 23 is caused, and the integrated circuit package apparatus is faulty. Therefore, the anti-pad 211 is deployed around the first metal through hole 26 on each of the at least one ground plane 21, where the gap is formed between the at least one ground plane 21 and the first metal through hole 26, and the at least one ground plane 21 is insulated from the first metal through hole 26.

It should be noted that this embodiment of the present disclosure imposes no specific limitation on a size, a shape, and a quantity of the anti-pad 211.

Figure 5:
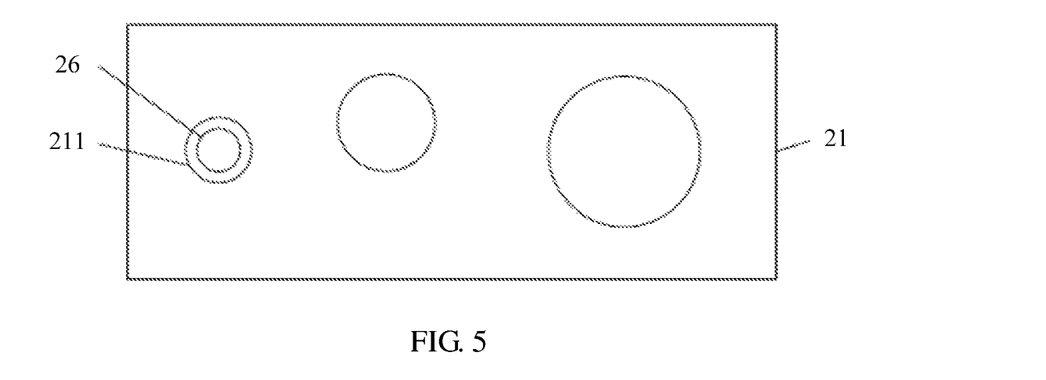
FIG. 5 is a top view of at least one ground plane of another type according to an embodiment of the present disclosure.
Figure 6:
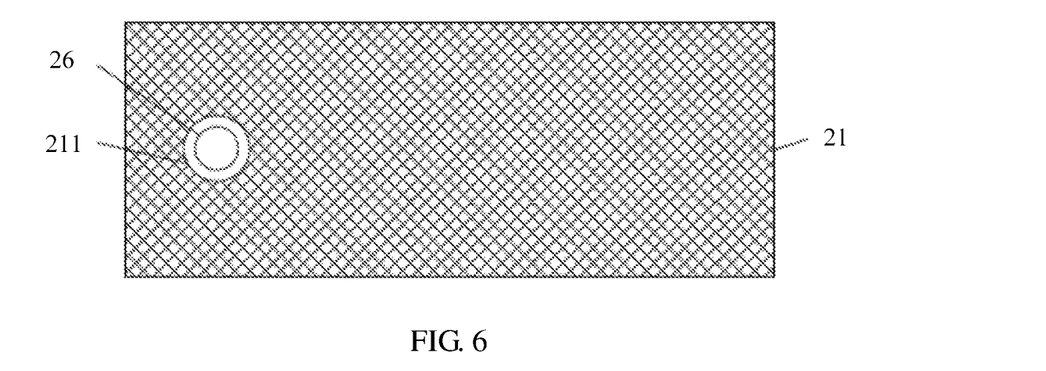
FIG. 6 is a top view of at least one ground plane of still another type according to an embodiment of the present disclosure.

Further, for each ground plane in the at least one ground plane 21, the ground plane may be a complete plane, that is, the ground plane includes only the anti-pad 211. Certainly, the ground plane may also be an incomplete plane, that is, in addition to the anti-pad 211, the ground plane further includes a pore, and the pore is a hollow pore surrounded by the ground plane, as shown in FIG. 5, or the ground plane may be a mesh plane, the mesh plane includes multiple meshes, and for each mesh in the multiple meshes, the mesh is a hollow mesh surrounded by the ground plane, as shown in FIG. 6. This embodiment of the present disclosure imposes no specific limitation on a shape of the ground plane.

When there are fewer pores on the ground plane, the ground plane is more complete, an effect of isolating the antenna 23 from the non-antenna circuit by the at least one ground plane 21 is better, and isolation between the antenna 23 and the non-antenna circuit is higher.

It should be noted that because the package substrate 22 may be formed by alternately bonding multiple copper foil layers and multiple insulation layers, when the at least one ground plane 21 is being deployed, at least one copper foil layer may be grounded to form the at least one ground plane 21.

It should be noted that in an embodiment, the at least one ground plane 21 may also be another material, and this embodiment of the present disclosure imposes no specific limitation thereto.

Figure 7:
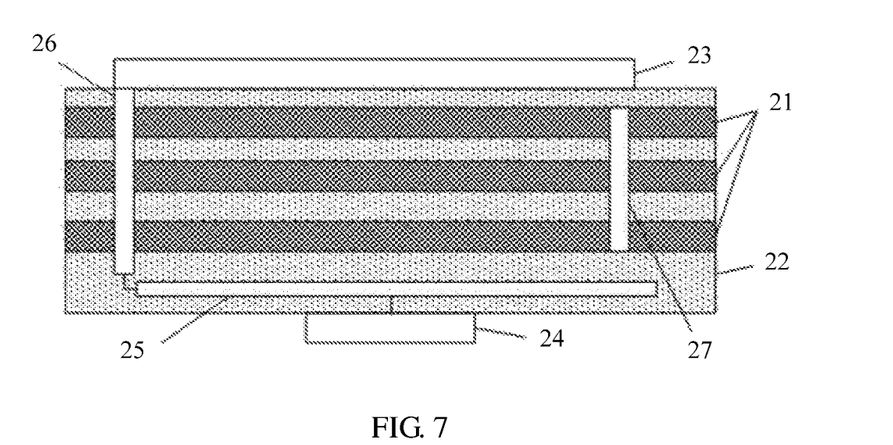
FIG. 7 is a cutaway drawing of another integrated circuit package apparatus according to an embodiment of the present disclosure.

Further, the at least one ground plane 21 may include only one ground plane, or as shown in FIG. 7, include multiple ground planes.

When the at least one ground plane 21 includes only one plane, materials are reduced, space occupied by the integrated circuit package apparatus is reduced, space utilization of the integrated circuit package apparatus is improved, and costs are reduced. When the at least one ground plane 21 includes multiple ground planes, the multiple ground planes can simultaneously isolate the antenna 23 from the non-antenna circuit, and an effect of isolating the antenna 23 from the non-antenna circuit is improved such that reliability and stability of the integrated circuit package apparatus are improved.

It should be noted that when the at least one ground plane 21 includes multiple ground planes, a quantity of the multiple ground planes may be set according to a requirement. Projection of the multiple ground planes in the thickness direction of the package substrate 22 may be the same or different, that is, sizes and shapes of the multiple ground planes may be the same, or may be different, and this embodiment of the present disclosure imposes no specific limitation thereto.

It should be further noted that when the at least one ground plane 21 includes multiple ground planes, two adjacent ground planes in the multiple ground planes are connected using a second metal through hole 27 in the thickness direction of the package substrate 22.

When the at least one ground plane 21 includes the multiple ground planes, and the multiple ground planes are connected using the second metal through hole 27, the second metal through hole 27 can connect the multiple ground planes as a whole. If a ground plane in the multiple ground planes is an incomplete ground plane, because the incomplete ground plane and another ground plane in the multiple ground planes are connected as a whole, a case in which an effect of isolating the antenna 23 from the non-antenna circuit by the incomplete ground plane is poor can be avoided, that is, isolation of the antenna 23 from the non-antenna circuit can be enhanced such that stability of the integrated circuit package apparatus is improved.

Figure 8:
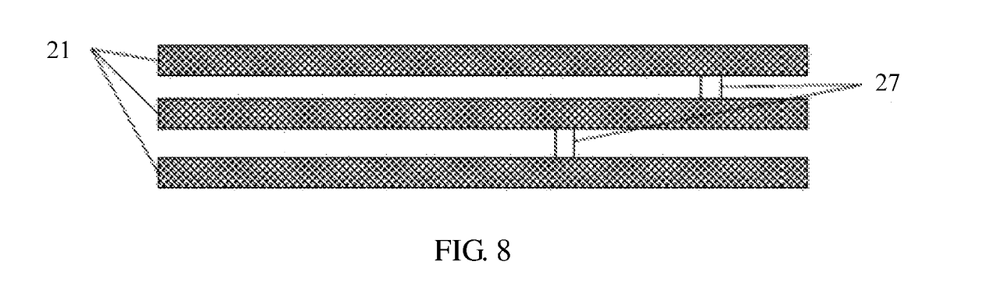
FIG. 8 is a side view of at least one ground plane according to an embodiment of the present disclosure.

Further, when the two adjacent ground planes in the multiple ground planes are connected using the second metal through hole 27 in the thickness direction of the package substrate 22, the multiple ground planes may be connected using one second metal through hole 27, or may be connected using multiple second metal through holes 27, as shown in FIG. 8. This embodiment of the present disclosure imposes no specific limitation on a location and a quantity of the second metal through hole 27.

Figure 9:
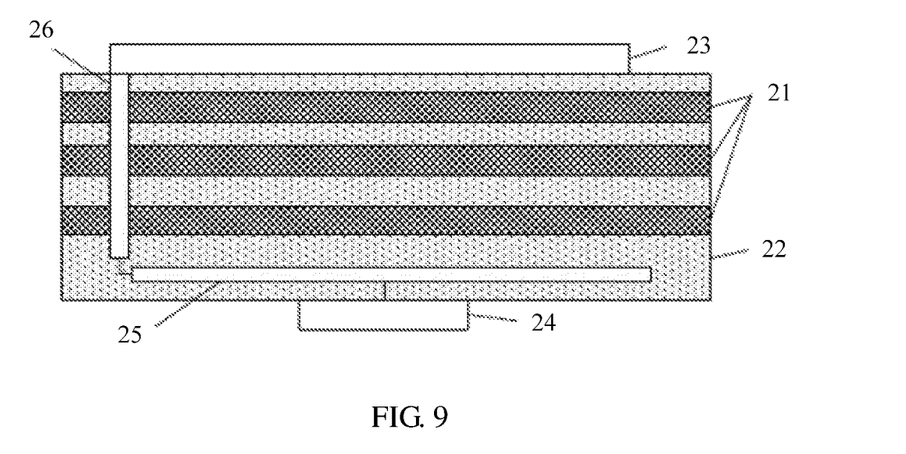
FIG. 9 is a cutaway drawing of still another integrated circuit package apparatus according to an embodiment of the present disclosure.

In addition, as shown in FIG. 9, when the at least one ground plane 21 includes multiple ground planes, the multiple ground planes may be connected without the second metal through hole 27.

When the at least one ground plane 21 includes the multiple ground planes, and the multiple ground planes are connected without the second metal through hole 27, the multiple ground planes are mutually independent, that is, the multiple ground planes are separately grounded. In this way, an operation of deploying the second metal through hole 27 on the multiple ground planes is omitted, thereby reducing complexity of a process for manufacturing the integrated circuit package apparatus. In addition, because the multiple ground planes are mutually independent and are separately grounded, when a ground plane in the multiple ground planes cannot be grounded due to damage or another reason, another ground plane in the multiple ground planes may still isolate the antenna 23 from the non-antenna circuit, that is, reliability of isolating the antenna 23 from the non-antenna circuit is improved.

Further, the chip 24 includes the following two deploying manners.

Figure 10A:
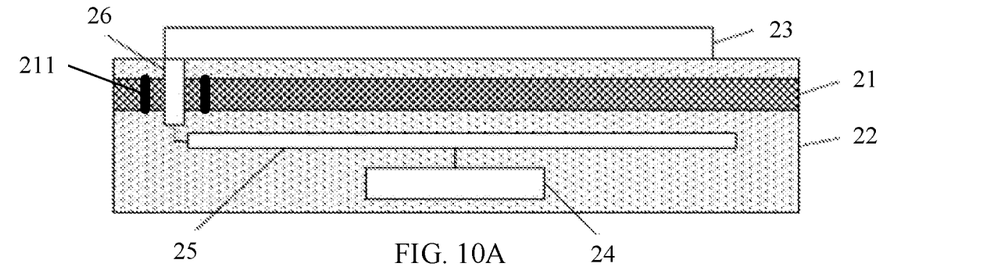
FIGS. 10A and 10B are cutaway drawings of still other integrated circuit package apparatuses according to an embodiment of the present disclosure.
Figure 10B:
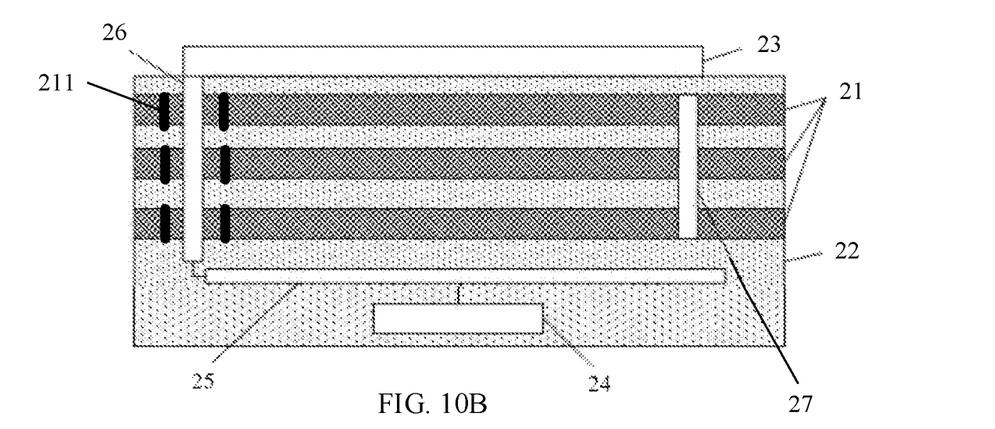

In a first deploying manner, as shown in FIGS. 10 and 10B, the chip 24 is deployed inside the package substrate 22.

When the chip 24 is deployed inside the package substrate 22, the package substrate 22 can protect the chip 24.

In a second deploying manner, the chip 24 is deployed on the external surface of the other side of the package substrate 22, as shown in FIG. 2.

When the chip 24 is deployed on the external surface of the other side of the package substrate 22, the complexity of the process for manufacturing the integrated circuit package apparatus is reduced, and the integrated circuit package apparatus is easy to implement.

In addition, in an application, the chip 24 may also be deployed in another manner according to an application requirement, provided that it can be ensured that the non-antenna circuit including the chip 24 can be isolated from the antenna 23 using the at least one ground plane 21. This embodiment of the present disclosure imposes no specific limitation thereto.

Figure 11:
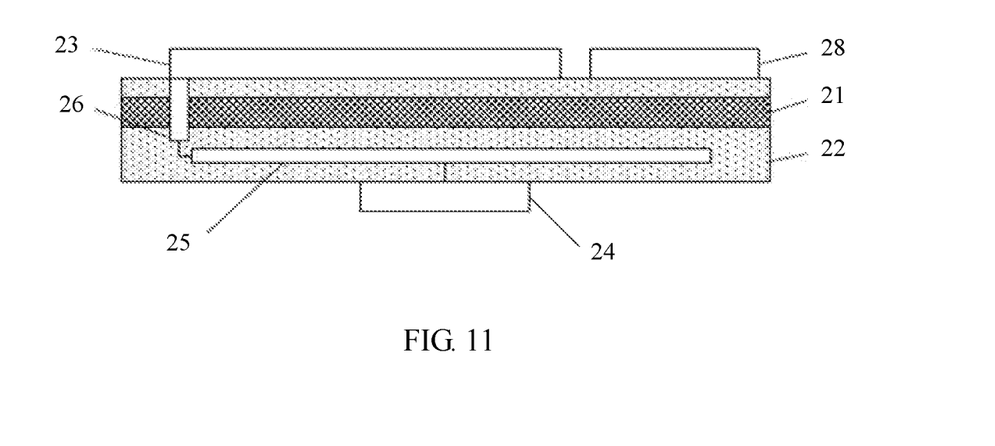
FIG. 11 is a cutaway drawing of still another integrated circuit package apparatus according to an embodiment of the present disclosure.

Further, as shown in FIG. 11, a ground clad copper 28 is deployed on the external surface of the side deployed with the antenna 23 on the package substrate 22, and space exists between the ground clad copper 28 and the antenna 23.

When only the antenna 23 is deployed on the external surface of the side deployed with the antenna 23 on the package substrate 22, because the antenna 23 usually occupies a relatively large area of the external surface of the package substrate 22, the external surface of the side deployed with the antenna 23 on the package substrate 22 has little copper content. When the integrated circuit package apparatus works, phenomena such as substrate warpage may occur on the package substrate 22 due to uneven distribution of copper content. Consequently, reliability of a welding joint in the integrated circuit package apparatus decreases, or even poor soldering or open welding occurs, thereby reducing stability of the integrated circuit package apparatus. Therefore, the ground clad copper 28 may be deployed on the external surface of the side deployed with the antenna 23 on the package substrate 22 in order to ensure even distribution of copper content of the package substrate 22, improve stability of the package substrate 22, thereby improving stability of the integrated circuit package apparatus.

Further, projection areas of the antenna 23, the chip 24, and the connection circuit 25 in the thickness direction of the package substrate 22 are located inside the at least one ground plane 21.

When the projection areas of the antenna 23, the chip 24, and the connection circuit 25 in the thickness direction of the package substrate 22 are located inside the at least one ground plane 21, an effect of isolating the antenna 23 from the non-antenna circuit by the at least one ground plane 21 can be improved, that is, isolation between the antenna 23 and the non-antenna circuit is enhanced such that reliability and stability of the integrated circuit package apparatus are improved.

It should be noted that it can be learned from the foregoing description that the projection of the multiple ground planes in the at least one ground plane 21 in the thickness direction of the package substrate 22 may be the same or different. Therefore, when the projection areas of the antenna 23, the chip 24, and the connection circuit 25 in the thickness direction of the package substrate 22 are located inside a projection area of the at least one ground plane 21, it can be determined that the projection areas of the antenna 23, the chip 24, and the connection circuit 25 in the thickness direction of the package substrate 22 are located inside the at least one ground plane 21.

It should be further noted that when the integrated circuit package apparatus further includes another non-antenna circuit, a projection area of the other non-antenna circuit in the thickness direction of the package substrate 22 is also located inside the at least one ground plane 21.

In this embodiment of the present disclosure, the integrated circuit package apparatus includes the package substrate, the antenna, the chip, and the connection circuit. First, the package substrate includes at least one ground plane 21, and the antenna is deployed on the external surface of one side of the package substrate using the etching process such that sensitivity, precision, and work efficiency of the antenna are improved. Then, the antenna is located on one side of the at least one ground plane 21, and the non-antenna circuit such as the chip and the connection circuit are deployed on the other side of the at least one ground plane 21, where the antenna is isolated from the non-antenna circuit using the at least one ground plane, and isolation between the antenna and the non-antenna circuit is enhanced. Therefore, signals between the antenna and the non-antenna circuit are not mutually interfered, and reliability and stability of the integrated circuit package apparatus are improved, in addition, the at least one ground plane further reduces difficulty of controlling impedance of the antenna, and stability of the integrated circuit package apparatus is further improved. Finally, the antenna is connected to the chip using the connection circuit and the first metal through hole in the thickness direction of the package substrate, and the ground clad copper is deployed on the external surface of the side deployed with the antenna on the package substrate such that a problem such as substrate warpage that is caused due to uneven distribution of copper content when the package substrate works is avoided, and stability of the integrated circuit package apparatus is further improved.

Figure 12:
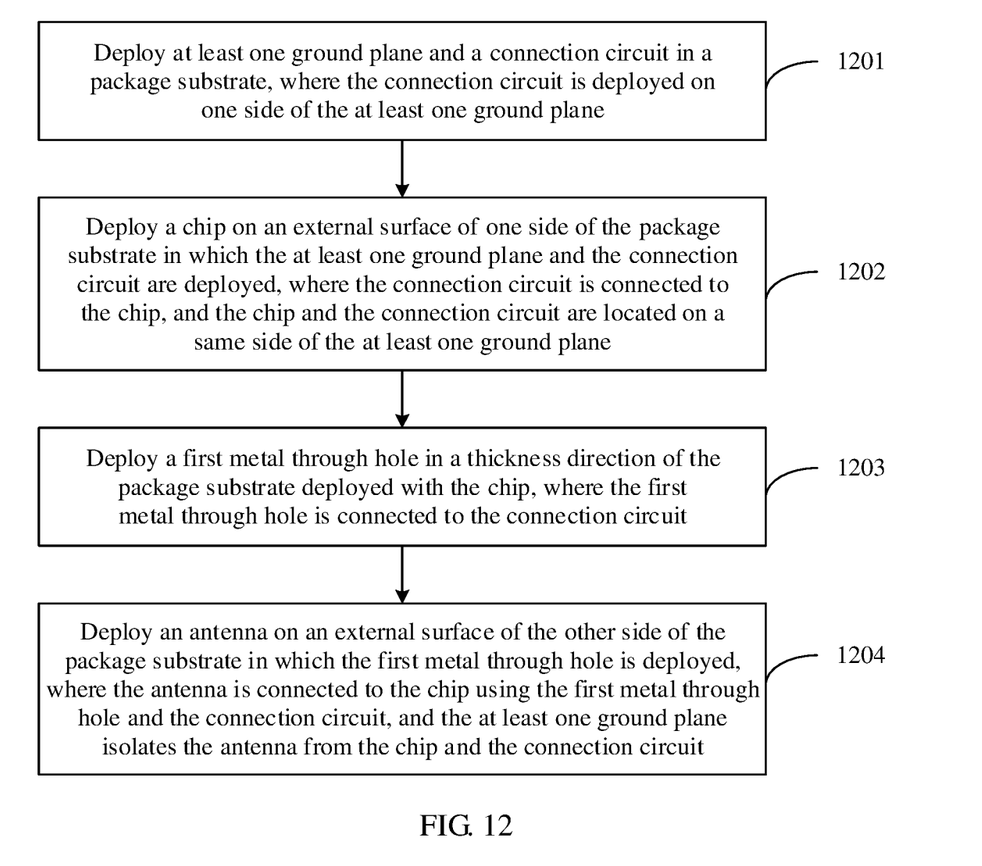
FIG. 12 is a flowchart of a method for manufacturing an integrated circuit package apparatus deployed with an antenna according to an embodiment of the present disclosure.

FIG. 12 is a flowchart of a method for manufacturing an integrated circuit package apparatus according to an embodiment of the present disclosure. Referring to FIG. 12, the method includes the following steps.

Step 1201: Deploy at least one ground plane and a connection circuit in a package substrate, where the connection circuit is deployed on one side of the at least one ground plane.

Because the package substrate is generally formed by alternately bonding multiple copper foil layers and multiple insulation layers, when the at least one ground plane is being deployed, at least one copper foil layer may be grounded to form the at least one ground plane. When the connection circuit is being deployed, the required connection circuit may be formed, using an etching process, at any copper foil layer on one side of the at least one grounded copper foil layer.

Further, an anti-pad is deployed on each ground plane in the at least one ground plane, and the anti-pad encircles the first metal through hole, and a gap between the at least one ground plane and the first metal through hole is formed, to insulate the at least one ground plane from the first metal through hole.

Because the first metal through hole is connected to the antenna, when the at least one ground plane is connected to the first metal through hole, a short circuit of the antenna is caused, and consequently, stability of the integrated circuit package apparatus is reduced. Therefore, the anti-pad may be deployed on each ground plane in the at least one ground plane in order to insulate the at least one ground plane from the first metal through hole.

Each ground plane in the at least one ground plane may be drilled, and then the anti-pad is deployed.

Further, when the at least one ground plane includes multiple ground planes, a second metal through hole in a thickness direction of the package substrate is deployed between two adjacent ground planes in the multiple ground planes in order to connect the two adjacent ground planes in the multiple ground planes.

When the multiple ground planes are connected as a whole using the second metal through hole, if a ground plane in the multiple ground planes is an incomplete ground plane, because the incomplete ground plane and another ground plane in the multiple ground planes are connected as a whole, a case in which an effect of isolating the antenna from a non-antenna circuit by the incomplete ground plane is poor can be avoided, and isolation of the antenna from the non-antenna circuit can be enhanced such that stability of the integrated circuit package apparatus is improved.

When the second metal through hole is being deployed, the two adjacent ground planes in the multiple ground planes are first drilled to form a through hole, and then the second metal through hole is formed on the through hole using an electroplating process.

It should be noted that for a method of deploying the second metal through hole, refer to related technologies, and this embodiment of the present disclosure imposes no specific limitation thereto.

Step 1202: Deploy a chip on an external surface of one side of the package substrate in which the at least one ground plane and the connection circuit are deployed, where the connection circuit is connected to the chip, and the chip and the connection circuit are located on a same side of the at least one ground plane.

In a first possible manner, the chip may be deployed, in a welding manner, on the external surface of one side of the package substrate in which the at least one ground plane and the connection circuit are deployed. In a second possible manner, a slot is deployed on the external surface of one side of the package substrate in which the at least one ground plane and the connection circuit are deployed, and the chip is inserted into the slot.

It should be noted that when the chip is deployed in the first possible manner, reliability of connecting the chip and the package substrate is ensured in the welding manner, and stability of connecting the chip and the package substrate in which the at least one ground plane and the connection circuit are deployed can be improved such that stability of the integrated circuit package apparatus is improved. When the chip is deployed in the second possible manner, when the chip is damaged, the chip can be changed without changing the entire integrated circuit package apparatus, thereby reducing costs.

Step 1203: Deploy a first metal through hole in a thickness direction of the package substrate deployed with the chip, where the first metal through hole is connected to the connection circuit.

Drilling may be performed in the thickness direction of the package substrate deployed with the chip, to form a through hole, and then the first metal through hole is formed on the through hole using an electroplating process.

It should be noted that for a method of forming the first metal through hole, refer to related technologies, and this embodiment of the present disclosure imposes no specific limitation thereto.

Step 1204: Deploy an antenna on an external surface of the other side of the package substrate in which the first metal through hole is deployed, where the antenna is connected to the chip using the first metal through hole and the connection circuit, and the at least one ground plane isolates the antenna from the chip and the connection circuit.

When the antenna is being deployed on the external surface of the other side of the package substrate in which the first metal through hole is deployed, the antenna may be formed, using an etching process or an electroplating process, on the external surface of the other side of the package substrate in which the first metal through hole is deployed.

Precision of an antenna that is deployed using the etching process is higher than precision of an antenna that is deployed using the electroplating process. This avoids a frequency offset caused by an excessively large antenna precision error, and avoids a problem that impedance of the antenna mismatches impedance of the integrated circuit package apparatus because it is difficult to control the impedance of the antenna due to the electroplating process.

It should be noted that because the at least one ground plane isolates the antenna from the chip and the connection circuit, mutual interference of signals between the antenna and a non-antenna circuit including the connection circuit and the chip is avoided, and work efficiency and stability of the integrated circuit package apparatus are improved.

Further, a ground clad copper is deployed on the external surface of the other side of the package substrate deployed with the antenna, where space exists between the ground clad copper and the antenna.

The ground clad copper may be formed, using the etching or electroplating process, on the external surface of the other side of the package substrate deployed with the antenna.

It should be noted that for a method of deploying the ground clad copper, refer to related technologies, and this embodiment of the present disclosure imposes no specific limitation thereto.

It should be further noted that the ground clad copper is deployed on the external surface of the other side of the package substrate deployed with the antenna in order to ensure even distribution of copper content of the package substrate deployed with the antenna, and avoid phenomena such as substrate warpage caused due to uneven distribution of copper content on the package substrate deployed with the antenna, thereby improving stability of the integrated circuit package apparatus.

Further, a package pin may be deployed, using a welding process, on the side, deployed with the chip, of the package substrate deployed with the antenna.

It should be noted that when the package pin is being deployed, the package pin may also be deployed, according to an actual requirement, on another location of the package substrate deployed with the antenna. This embodiment of the present disclosure imposes no specific limitation thereto.

In this embodiment of the present disclosure, the at least one ground plane and the connection circuit may be deployed in the package substrate, the chip is deployed on the external surface of one side of the package substrate in which the at least one ground plane and the connection circuit are deployed, then the first metal through hole is deployed in the thickness direction of the package substrate deployed with the chip, and finally the antenna is deployed on the external surface of the other side of the package substrate in which the first metal through hole is deployed. Because the non-antenna circuits such as the connection circuit and the chip are located on a same side of the at least one ground plane, and the antenna is located on the other side of the at least one ground plane, the at least one ground plane isolates the antenna from the non-antenna circuit including the chip and the connection circuit, mutual interference of signals between the antenna and the non-antenna circuit is avoided, and work efficiency and stability of the integrated circuit package apparatus are improved. In addition, the anti-pad may be deployed on each ground plane in the at least one ground plane, where the gap is formed between the at least one ground plane and the first metal through hole in order to insulate the at least one ground plane from the first metal through hole, avoid a short circuit of the antenna that is caused because the antenna is connected to the at least one ground plane, and improve stability of the integrated circuit package apparatus.

Figure 13:
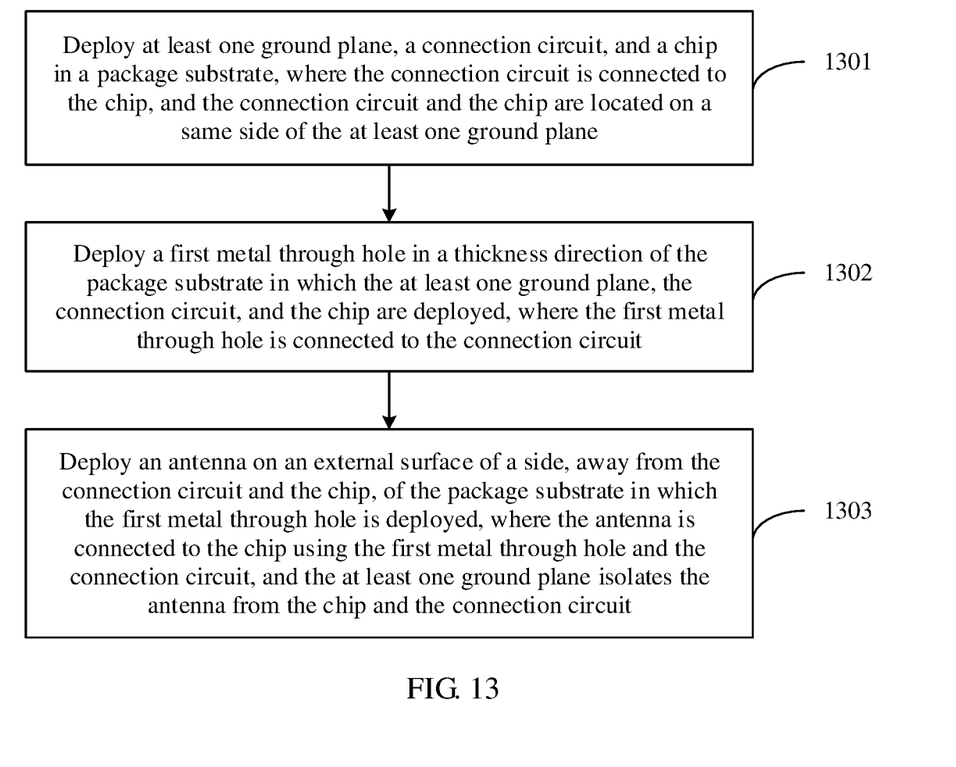
FIG. 13 is a flowchart of another method for manufacturing an integrated circuit package apparatus deployed with an antenna according to an embodiment of the present disclosure.

FIG. 13 is a flowchart of a method for manufacturing an integrated circuit package apparatus according to an embodiment of the present disclosure. Referring to FIG. 13, the method includes the following steps.

Step 1301: Deploy at least one ground plane, a connection circuit, and a chip in a package substrate, where the connection circuit is connected to the chip, and the connection circuit and the chip are located on a same side of the at least one ground plane.

When the chip is deployed in the package substrate, a groove may be deployed in the package substrate, the chip is embedded into the groove, and the chip is connected to the connection circuit.

It should be noted that a method for deploying the at least one ground plane and the connection circuit in the package substrate may be the same as the method for deploying the at least one ground plane and the connection circuit in the package substrate in step 1201.

Further, an anti-pad is deployed on each ground plane in the at least one ground plane, and the anti-pad encircles the first metal through hole, and a gap between the at least one ground plane and the first metal through hole is formed, to insulate the at least one ground plane from the first metal through hole.

A method for deploying the anti-pad on each ground plane in the at least one ground plane may be the same as the method for deploying the anti-pad on each ground plane in the at least one ground plane after step 1201.

Further, when the at least one ground plane includes multiple ground planes, a second metal through hole in a thickness direction of the package substrate is deployed between two adjacent ground planes in the multiple ground planes in order to connect the two adjacent ground planes in the multiple ground planes.

A method for deploying the second metal through hole between the two adjacent ground planes in the multiple ground planes in the thickness direction of the package substrate may be the same as the method for deploying the second metal through hole between the two adjacent ground planes in the multiple ground planes in the thickness direction of the package substrate after step 1201.

Step 1302: Deploy a first metal through hole in a thickness direction of the package substrate in which the at least one ground plane, the connection circuit, and the chip are deployed, where the first metal through hole is connected to the connection circuit.

A method for deploying the first metal through hole may be the same as the method for deploying the first metal through hole in step 1203.

Step 1303: Deploy an antenna on an external surface of a side, away from the connection circuit and the chip, of the package substrate in which the first metal through hole is deployed, where the antenna is connected to the chip using the first metal through hole and the connection circuit, and the at least one ground plane isolates the antenna from the chip and the connection circuit.

A method for deploying the antenna may be the same as the method for deploying the antenna in step 1204.

Further, a ground clad copper is deployed on the external surface of the side deployed with the antenna on the package substrate, and space exists between the ground clad copper and the antenna.

A method for deploying the ground clad copper may be the same as the method for deploying the ground clad copper after step 1204.

In this embodiment of the present disclosure, the at least one ground plane, the connection circuit, and the chip are deployed in the package substrate, the first metal through hole is deployed in the thickness direction of the package substrate in which the at least one ground plane, the connection circuit, and the chip are deployed, and the antenna is deployed on the external surface of the side, away from the connection circuit and the chip, of the package substrate in which the first metal through hole is deployed. Because the non-antenna circuits such as the connection circuit and the chip are located on a same side of the at least one ground plane, and the antenna is located on the other side of the at least one ground plane, the at least one ground plane isolates the antenna from the non-antenna circuit including the chip and the connection circuit, mutual interference of signals between the antenna and the non-antenna circuit is avoided, and work efficiency and stability of the integrated circuit package apparatus are improved. In addition, because the chip is deployed in the package substrate, the package substrate may protect the chip such that stability of the chip is improved, and stability of the integrated circuit package apparatus is improved. Finally, the anti-pad may be deployed on each ground plane in the at least one ground plane, where the gap is formed between the at least one ground plane and the first metal through hole in order to insulate the at least one ground plane from the first metal through hole, avoid a short circuit of the antenna that is caused because the antenna is connected to the at least one ground plane, and improve stability of the integrated circuit package apparatus.

Persons of ordinary skill in the art may understand that all or some of the steps of the embodiments may be implemented by hardware or a program instructing related hardware. The program may be stored in a computer-readable storage medium. The storage medium may include a read-only memory, a magnetic disk, or an optical disc.

The foregoing descriptions are merely example embodiments of the present disclosure, but are not intended to limit the present disclosure. Any modification, equivalent replacement, and improvement made without departing from the spirit and principle of the present disclosure shall fall within the protection scope of the present disclosure.

What is claimed is:

1. An integrated circuit package apparatus, comprising:
   an antenna;
   a package substrate comprising at least one ground plane, wherein the package substrate comprises a plurality of conductive layers and a plurality of insulation layers that are alternately bonded together, wherein at least one conductive layer of the plurality of conductive layers is grounded to form the at least one ground plane, wherein the antenna is deployed on an external surface of a first side of the package substrate, and wherein the antenna is located on one side of the at least one ground plane;
   a chip, wherein a projection of the entire antenna extends in a two dimensional (2D) view towards the chip in a thickness direction entirely encompassing the chip in the 2D view; and
   a connection circuit, wherein the chip and the connection circuit are deployed on a second side of the at least one ground plane and are deployed inside the package substrate, wherein the antenna is isolated from the chip and the connection circuit using the at least one ground plane, and wherein the antenna is coupled to the chip using the connection circuit, and wherein an outer edge of the antenna is physically coupled to the chip using a first metal through hole in the thickness direction of the package substrate.

2. The integrated circuit package apparatus of claim 1, wherein an anti-pad is deployed around the first metal through hole on each of the at least one ground plane, wherein the anti-pad encircles the first metal through hole, wherein the anti-pad is configured to form a gap between the at least one ground plane and the first metal through hole, and wherein the at least one ground plane is insulated from the first metal through hole.

3. The integrated circuit package apparatus of claim 2, wherein the at least one ground plane comprises a plurality of ground planes, and wherein two adjacent ground planes in the plurality of ground planes are coupled using a second metal through hole in the thickness direction of the package substrate.

4. The integrated circuit package apparatus of claim 1, wherein a ground clad copper is deployed on the external surface of the first side of the package substrate, and wherein a space exists between the ground clad copper and the antenna.

5. The integrated circuit package apparatus of claim 1, wherein projection areas of the antenna, the chip, and the connection circuit in the thickness direction of the package substrate are located inside the at least one ground plane.

6. The integrated circuit package apparatus of claim 1, wherein the at least one ground plane comprises a plurality of ground planes.

7. The integrated circuit package apparatus of claim 1, wherein the integrated circuit package apparatus does not include a plastic package body.

8. An apparatus, comprising:
   an antenna;
   a package substrate comprising at least one ground plane, wherein the package substrate comprises a plurality of conductive layers and a plurality of insulation layers that are alternately bonded together, wherein at least one conductive layer of the plurality of conductive layers is grounded to form the at least one ground plane, wherein the antenna is deployed on an external surface of a first side of the package substrate, and wherein the antenna is located on one side of the at least one ground plane;
   a chip, wherein a projection of the entire antenna extends in a two dimensional (2D) view towards the chip in a thickness direction entirely encompassing the chip in the 2D view; and
   a connection circuit, wherein the chip and the connection circuit are deployed on a second side of the at least one ground plane and are deployed inside the package substrate, wherein the antenna is isolated from the chip and the connection circuit using the at least one ground plane, and wherein the antenna is coupled to the chip using the connection circuit, and wherein an outer edge of the antenna is physically coupled to the chip using a first metal through hole.

9. The apparatus of claim 8, wherein an anti-pad is deployed around the first metal through hole on each of the at least one ground plane, wherein the anti-pad encircles the first metal through hole, wherein the anti-pad is configured to form a gap between the at least one ground plane and the first metal through hole, and wherein the at least one ground plane is insulated from the first metal through hole.

10. The apparatus of claim 9, wherein the at least one ground plane comprises a plurality of ground planes, and wherein two adjacent ground planes in the plurality of ground planes are coupled using a second metal through hole in the thickness direction of the package substrate.

11. The apparatus of claim 8, wherein a ground clad copper is deployed on the external surface of the first side of the package substrate, and wherein a space exists between the ground clad copper and the antenna.

12. The apparatus of claim 8, wherein projection areas of the antenna, the chip, and the connection circuit in the thickness direction of the package substrate are located inside the at least one ground plane.

13. The apparatus of claim 8, wherein the apparatus does not include a plastic package body.

14. The apparatus of claim 8, wherein an anti-pad encircles the first metal through hole.

15. An apparatus, comprising:
an antenna;
a package substrate comprising at least one ground plane, wherein the package substrate comprises a plurality of conductive layers and a plurality of insulation layers that are alternately bonded together, wherein at least one conductive layer of the plurality of conductive layers is grounded to form the at least one ground plane, wherein the antenna is deployed on an external surface of a first side of the package substrate, and wherein the antenna is located on one side of the at least one ground plane;
a non-antenna circuit, comprising:
 a chip, wherein a projection of the entire antenna extends in a two dimensional (2D) view towards the chip in a thickness direction entirely encompassing the chip in the 2D view; and
 a connection circuit, wherein the non-antenna circuit is deployed on a second side of the at least one ground plane and is deployed inside the package substrate, wherein the antenna is isolated from the chip and the connection circuit using the at least one ground plane, and wherein the antenna is coupled to the chip using the connection circuit, and wherein an outer edge of the antenna is physically coupled to the chip using a first metal through hole in the thickness direction.

16. The apparatus of claim 15, wherein an anti-pad is deployed around the first metal through hole on each of the at least one ground plane, wherein the anti-pad encircles the first metal through hole, wherein the anti-pad is configured to form a gap between the at least one ground plane and the first metal through hole, and wherein the at least one ground plane is insulated from the first metal through hole.

17. The apparatus of claim 16, wherein the at least one ground plane comprises a plurality of ground planes, and wherein two adjacent ground planes in the plurality of ground planes are coupled using a second metal through hole in the thickness direction of the package substrate.

18. The apparatus of claim 15, wherein a ground clad copper is deployed on the external surface of the first side of the package substrate, and wherein a space exists between the ground clad copper and the antenna.

19. The apparatus of claim 15, wherein projection areas of the antenna, the chip, and the connection circuit in the thickness direction of the package substrate are located inside the at least one ground plane.

20. The apparatus of claim 15, wherein the apparatus does not include a plastic package body.

\* \* \* \* \*